United States Patent
Gao

(10) Patent No.: US 11,692,744 B2
(45) Date of Patent: Jul. 4, 2023

(54) EXTERNAL COOLING UNIT DESIGN FOR A DATA CENTER WITH TWO PHASE FLUID THERMAL LOOPS

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

(*) Notice: Subject to any disclaimer, the term of this patent is extended or adjusted under 35 U.S.C. 154(b) by 216 days.

(21) Appl. No.: 16/685,629

(22) Filed: Nov. 15, 2019

(65) Prior Publication Data

US 2021/0148608 A1 May 20, 2021

(51) Int. Cl.
*F25B 9/00* (2006.01)
*H05K 7/20* (2006.01)
*F24F 5/00* (2006.01)

(52) U.S. Cl.
CPC ............ *F25B 9/002* (2013.01); *F24F 5/0014* (2013.01); *H05K 7/20318* (2013.01); *F25B 2321/0252* (2013.01)

(58) Field of Classification Search
CPC ......... H05K 7/20318; F25B 2321/0252; F25B 2600/2501; F25B 2400/0411; F25B 49/02; F24F 5/0035; Y02B 30/70
See application file for complete search history.

(56) References Cited

U.S. PATENT DOCUMENTS

| | | | | |
|---|---|---|---|---|
| 2,221,530 A | * | 11/1940 | Strang | F25B 39/04 62/162 |
| 3,659,623 A | * | 5/1972 | Facius | F28F 25/04 137/255 |
| 6,220,041 B1 | * | 4/2001 | Okazaki | F25B 41/00 62/149 |
| 8,650,898 B2 | * | 2/2014 | Ma | F25B 41/00 62/333 |
| 2019/0110379 A1 | * | 4/2019 | Cui | H05K 7/20836 |
| 2019/0178540 A1 | * | 6/2019 | Facemyer | F25B 49/02 |

* cited by examiner

*Primary Examiner* — Lionel Nouketcha
(74) *Attorney, Agent, or Firm* — Womble Bond Dickinson (US) LLP

(57) ABSTRACT

A cooling system includes an ingress port to receive refrigerant in a vapor form from an evaporator, an egress port to return refrigerant in a liquid form back to the evaporator, a condenser coupled to the ingress port and the egress port, and a compressor coupled to the ingress port and the condenser. When the cooling system operates in a first mode, the condenser is configured to receive and condense the refrigerant from the vapor form into the liquid form and to return the refrigerant in the liquid form to the regress port. When the cooling system operates in a second mode, the compressor is configured to compress the refrigerant in the vapor form and to supply the compressed refrigerant to the condenser to be condensed therein.

20 Claims, 4 Drawing Sheets

US 11,692,744 B2

EXTERNAL COOLING UNIT DESIGN FOR A DATA CENTER WITH TWO PHASE FLUID THERMAL LOOPS

FIELD OF THE DISCLOSURE

Embodiments of the present invention relate generally to cooling systems. More particularly, embodiments of the invention relate to cooling systems for data centers.

BACKGROUND

Data centers are mission critical facilities which are used for housing IT equipment and servers. The variation in business requirements and use cases, variation in compute power requirements and so on, cause significant variations in IT equipment design. The variations in IT design include variation in different types of server management solutions. This brings challenges to data center cooling infrastructure design, since the data center and data center cooling need to be continuously and flexibly supporting IT deployment and operation. In addition, the cooling system is critical for the data center in terms of Op-ex (operating expenses) and Cap-ex (capital expenditures). One of the new challenges for data center cooling systems is to minimize floor space requirement.

There has been a lot of innovative work from both industry and academia focusing on cooling system design. There are many existing cooling solutions or cooling products available in the market. However, continuous innovation is desirable on cooling systems for the dynamic variations in the use cases as discussed. For directly cooling technology using a two phase fluid, there are already some server and rack solutions, however there are limits to scaling these solutions on the infrastructure to support these use cases or deploy in scale.

Energy efficiency (operating cost) is also important, since for most data centers, a cooling system consumes a great portion of the data center power usage. In addition, a cooling system requires a significant amount of floor space, and this is a major challenge when data center spacing is limited at some locations.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
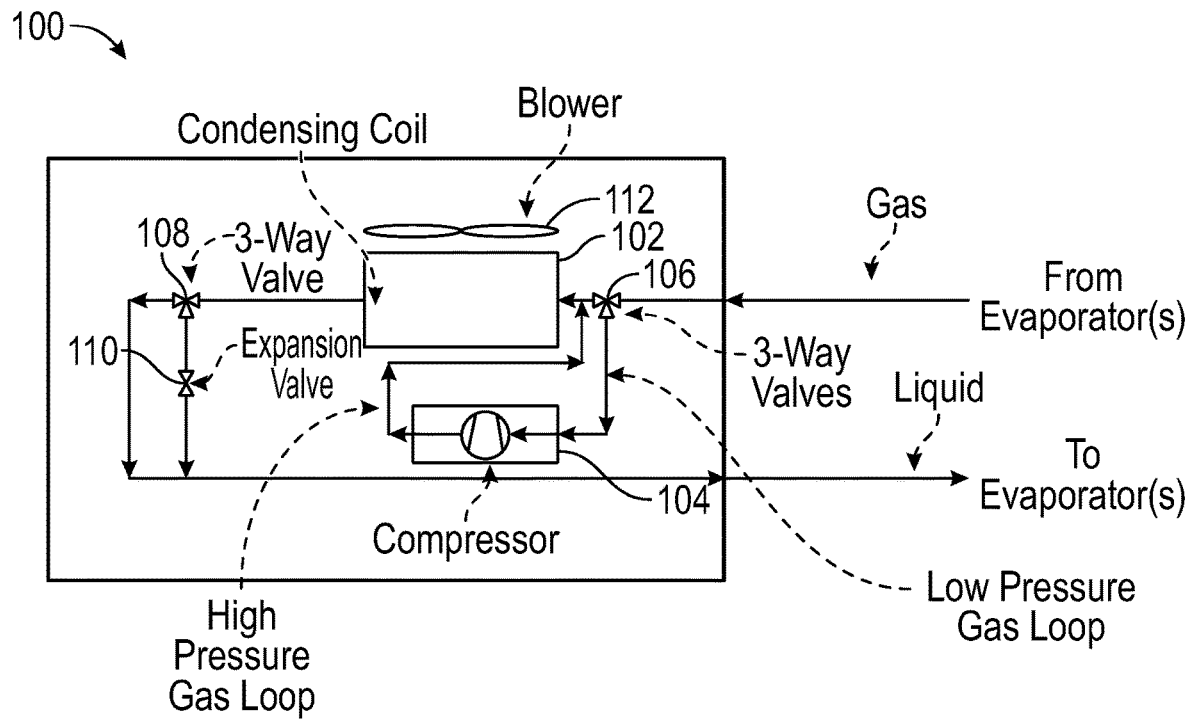
FIG. 1 is a schematic presentation of a cooling unit architecture, in an embodiment.

Various embodiments and aspects of the disclosures will be described with reference to details discussed below, and the accompanying drawings will illustrate the various embodiments. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosures.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment. A data center cooling system is one of the most critical infrastructures for data centers, especially for hyper-scale data center owners and operators. The cooling system maintains a normal thermal environment for operating mission critical facilities. Cost, reliability, and compatibilities with the data center building design and IT (information technology) design, as well as energy efficiency and capacity per footprint, are important.

More and more cooling technologies have been applied on the new generation of IT equipment and racks. Some of the servers and racks are implemented with liquid cooling devices and/or other thermal management technologies, either single phase liquid cooling or two phase liquid cooling. Therefore, these areas that use a full system level and data center building level cooling unit are important.

For traditional cooling systems, a refrigeration cycle is used in a multiple cooling loop architecture that uses a condenser, a compressor, an evaporator, an expansion valve and connecting equipment such as valves and pipes, lines or tubes, and so on in the system for delivering chilled water to the cooling unit such as CRAH (computer room air handlers)/or delivering refrigerant to the cooling coil to the cooling unit such as CRAC (computer room air conditioning) and RDHX (rear door heat exchangers). The solution is complex, including a cooling water loop and chilled water loop. The shortfalls are: occupies a lot of data center building space; low energy efficiency; and large initial cost. In addition, these solutions are designed for operating air cooling data centers.

Another existing solution is an indirect evaporative cooler. The solution is used for cooling air cooled data centers, it cannot be used for a liquid cooling data center, or it cannot be used for operating liquid cooling equipment or immersion cooling equipment directly.

Another existing solution is a liquid cooling system, such as using a traditional cooling tower or a dry cooler. This solution is designed for single phase liquid cooling in a data center.

Various cooling unit architectures are described herein with variations on a core set of features. The cooling unit is used in a two phase cooling loop for data center applications in some embodiments, among other possibilities. A refrigerant vapor/gas goes into the condenser of the cooling unit and changes phase to liquid form, and this cooling liquid is then supplied by the cooling unit to evaporators that cool the data center (or other) equipment. A condensing coil (or other form of condenser) is used to condense the refrigerant vapor to liquid form. A blower is used for moving external cooling air through the condenser in one of the embodiments that air cooled condenser is used.

Two main cooling loops are designed within the cooling unit and the cooling unit can switch between the two cooling loops. The first loop is a natural convection cooling loop. Refrigerant vapor rises up to the condenser from the evaporator and enters the condenser, condenses back to liquid and flows back to the evaporator driven by gravity. Within the evaporator, liquid changes phase to vapor absorbing heat, and within the condenser, vapor changes phase back to liquid releasing the heat. This operation mode, which works without a compressor, is designed to be used when ambient temperature/dry bulb/wet bulb temperature is low enough to support the natural convection cooling loop.

The second loop is designed for higher temperatures, which could be termed the extreme ambient condition. A refrigeration cycle is added to the system. The refrigerant vapor is switched to the second loop where a vapor compressor is activated and used to pressurize the refrigerant vapor before the refrigerant enters the condenser.

Various embodiments of the present architecture utilize a two phase fluid such as a refrigerant as the direct coolant and combine multiple functions in the two cooling loops in one cooling unit. Corresponding returning liquid loops are identified and designed within the cooling unit. The current design eliminates thermal loop design with multi-thermal loops and the corresponding supportive building infrastructure.

A cooling system includes an ingress port to receive refrigerant in a vapor form from an evaporator, an egress port to return refrigerant in a liquid form back to the evaporator, a condenser coupled to the ingress port and the egress port, and a compressor coupled to the ingress port and the condenser. When the cooling system operates in a first mode, the condenser is configured to receive and condense the refrigerant from the vapor form into the liquid form and to return the refrigerant in the liquid form to the regress port. When the cooling system operates in a second mode, the compressor is configured to compress the refrigerant in the vapor form and to supply the compressed refrigerant to the condenser to be condensed therein.

FIG. 1 is a schematic presentation of a cooling unit 100 architecture, in an embodiment. The cooling unit 100 is working with a two phase fluid, i.e., a refrigerant. The gas or vapor or two phase fluid returning form the evaporator goes into the cooling unit 100 from the vapor loop. Once the refrigerant enters the cooling unit 100, there are two types of operating modes. One operating mode, which could be called the first mode, is a thermosiphon natural convection loop, and one operating mode, which could be called the second mode, is a refrigeration cycle loop.

For the first mode, operating the cooling unit 100 in the natural convection loop, the refrigerant vapor goes into the condensing coil or condenser 102 and condenses back to the liquid form. The blower 112 or fan is used for blowing ambient air through the condensing coil or condenser 102 as a cooling fluid. When the refrigerant vapor is condensed back to the liquid form, the refrigerant goes to a liquid supply loop.

Referring to FIG. 1, for the first mode of operation, natural convection mode, the liquid loop is the one without the expansion valve 110 on the return side. The liquid refrigerant from the output of the condenser 102 is then supplied to the evaporator. The entire natural convection or thermosiphon loop does not use the compressor 104 and does not require any mechanical power for moving the fluid. Rather, the cooling unit 100 uses gravity to drive the recirculating refrigerant fluid, given the variations in density of vapor and liquid. That is, the denser refrigerant liquid is driven by gravity to flow down from the output of the condenser 102 to the evaporator(s), located at a lower elevation than the condenser. And, the less dense refrigerant vapor flows upward from the output(s) of the evaporator(s) to the condenser 102, located at a higher elevation than the evaporator(s).

When the ambient conditions, such as outside air temperature or airflow are able to supply sufficient cooling capacity, the cooling unit 100 uses the first mode, i.e., natural convection mode. When the ambient conditions are not adequate for supporting the operation of the cooling unit 100 in natural convection mode, the system switches to the second mode, the refrigeration cycle loop. The cooling unit 100 uses three-way valves 106, 108 for switching between the two modes with a control strategy. One three-way valve 106 is connected to an input of the condenser 102, an input of the compressor 104, and a return from the evaporator(s). Another three-way valve 108 is connected to an output of the condenser 102, an input of an expansion valve 110, and an outlet tube connecting and output of the expansion valve 110 to the evaporator(s).

In the second mode, the refrigeration cycle loop, the refrigerant vapor goes into the vapor compressor 104 before going into the condenser 102. With compression by the compressor 104, the low pressure refrigerant vapor becomes high pressure vapor and the corresponding condensation temperature increases with the increasing of the pressure. When the refrigerant vapor is condensed back to liquid phase by the condenser 102, the refrigerant is routed by a three-way valve 108 and passes through the expansion valve 110, then enters the liquid loop connecting to the evaporator.

The current design eliminates the traditional full infrastructure level chiller loop and uses it as an operating mode in the cooling unit. In addition, only one thermal loop is used in the cooling system, by which it is understood that the phase change refrigerant can be used for cooling the IT hardware directly or indirectly.

Figure 2:
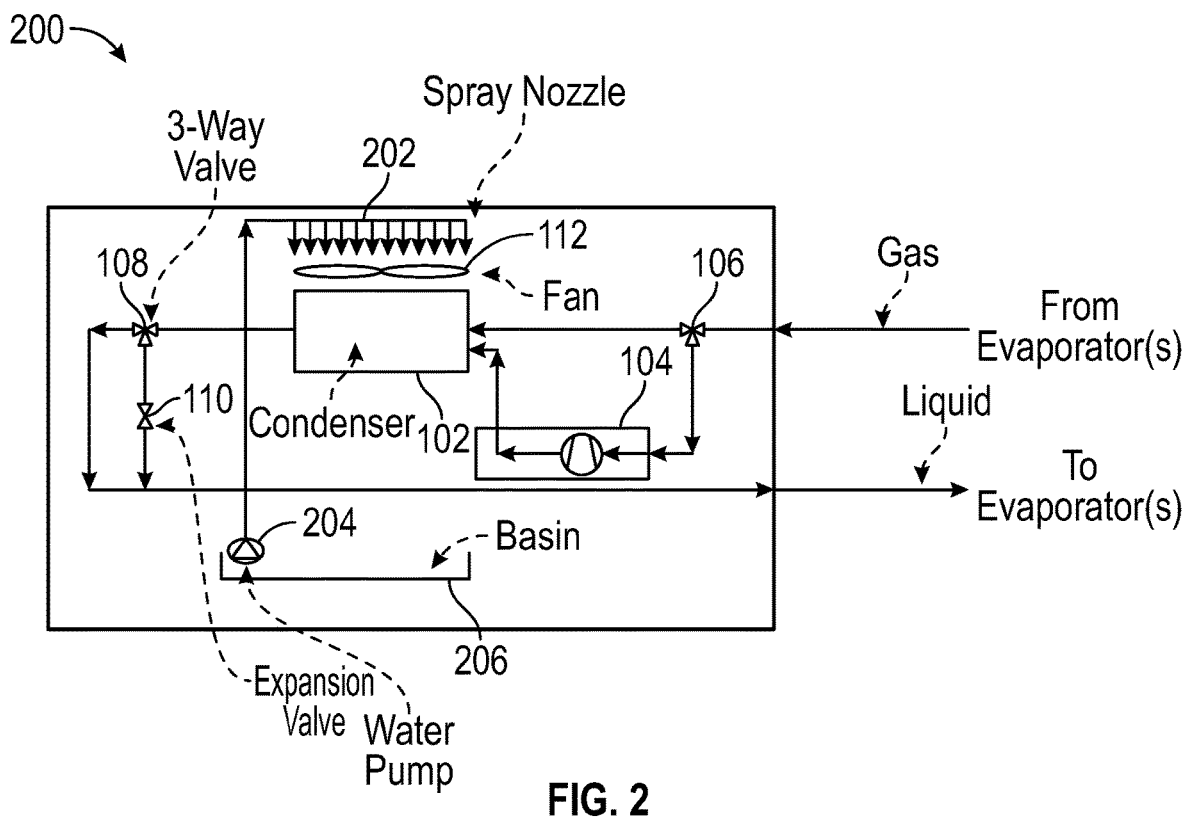
FIG. 2 is a schematic presentation of a cooling unit architecture, in an embodiment.

FIG. 2 is a schematic presentation of a cooling unit 200 architecture, in an embodiment. In this configuration, a wet operating mode is added to the system. An evaporative cooling spray nozzle 202, a pump 204, and in some versions a water basin 206, are added to the system. The pump 204 forces water from the water basin 206 or other source, to spray a mist from the spray nozzle 202, so that evaporative enables to approach the wet bulb temperature of the air that is being blown through the condenser 102 by the blower 112. The water is then dropped and caught by the water basin 206 and reused. This design enables the cooling unit 200 to utilize the air wet bulb temperature to achieve maximum cooling in the first, natural convection operating mode, especially in the low humidity areas.

Figure 3:
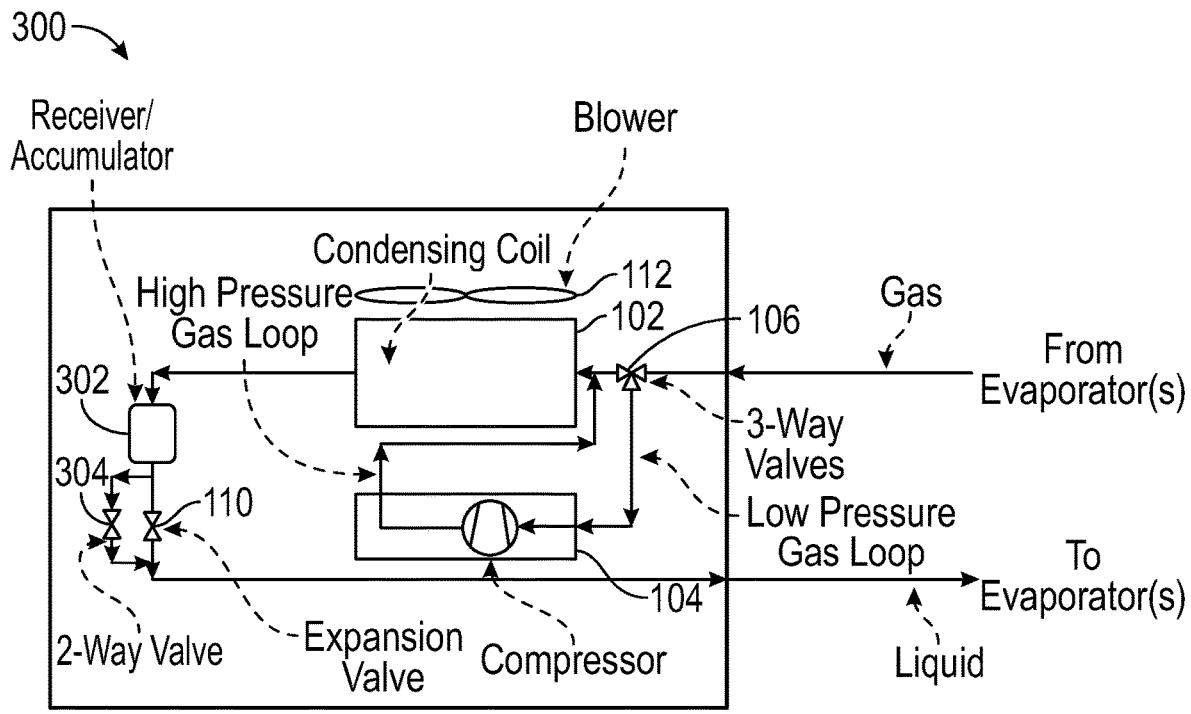
FIG. 3 is a schematic presentation of a cooling unit architecture, in an embodiment.

FIG. 3 is a schematic presentation of a cooling unit 300 architecture, in an embodiment. FIG. 3 adds a receiver or accumulator 302 as another design feature, in another of design for a liquid returning loop. Normally, the natural convection loop returning liquid loop is less complex than the refrigeration cycle loop. In the solution presented in FIG. 1 and FIG. 2, three-way valves 106, 108 are used for switching the different loops, manually or under direction of a controller in various embodiments. Embodiments of a cooling unit can also be designed using combinations of two-way valves, a three-way valve and a two-way valve, etc. In addition, a receiver or fluid accumulator 302 can be added to the liquid loop before the expansion valve 110 and two-way valve 304 across the expansion valve 110. For the natural convection mode, the two-way valve 304 is open. The two-way valve 304 is closed when the system is in the refrigeration cycle. The two loops may require an accurate control design for switching between each other, and a controller to operate the valves and the compressor 104, and the blower 112 in various embodiments. It needs to be mentioned that in some of the use cases, the control strategy may manage the switching of the two modes slowly for better system performance. This means that the two loops may function at the same time for a certain period of time.

Figure 4:
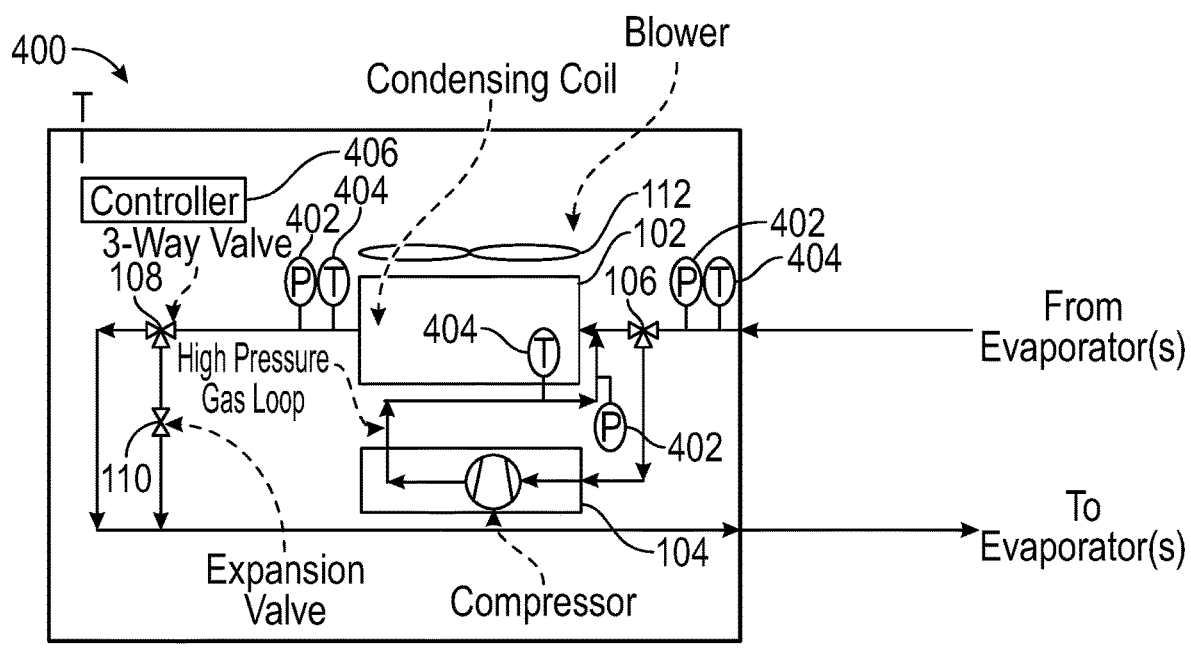
FIG. 4 depicts sensors assembled on a cooling unit, in an embodiment.

FIG. 4 depicts sensors assembled on a cooling unit 400, in an embodiment. The pressure sensors 402 and temperature sensors 404 are used for control of the entire cooling unit 400, including controlling the three-way valves 106, 108 switching between different loops, and controlling the condensing coil or condenser blower 112 turning on and off or at variable speed, the compressor 104 turning on and off or at variable speed, the evaporative cooling loop pump 204 (see FIG. 2) and so on in various combinations in various embodiments. A controller 406 operates the three-way valves 106, 108 (or other valves in variations), the compressor 104, the blower 112 or fan and possibly other components in various embodiments, switching between operating modes based on input from the pressure sensors 402 and temperature sensors 404, or any other input based on the control strategy design.

Figure 5:
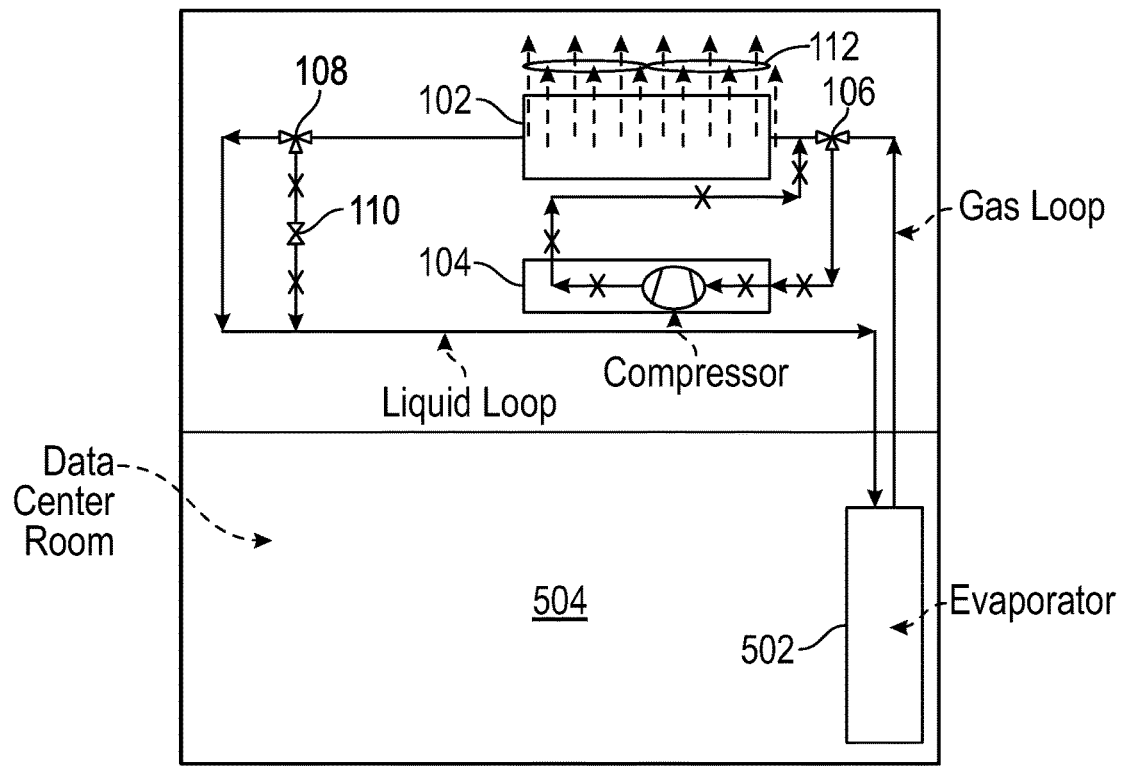
FIG. 5 depicts a system implementation using the cooling unit in the natural convection mode, in an embodiment.

FIG. 5 depicts a system implementation using the cooling unit 500 in the natural convection mode, in an embodiment. FIG. 5 shows the system application in a data center use case. The cooling unit 500 is located above the data center room, so that gravity feed of the refrigerant is operational in the natural convection mode. In the first or natural convection mode, the three-way valves 106, 108 (or other combination of valves in various embodiments) are operated so that the refrigerant follows the path that is not crossed out by "X" in FIG. 5, and the compressor 104 is not operated, also as indicated by "X". The refrigerant is routed through the condenser, from the condenser through one or more evaporators 502, and from the evaporator(s) 502 back to the condenser in a natural convection loop without the compressor 104.

It should be appreciated that the cooling loop can be connected to different types of cooling equipment in various use cases. The evaporators 502 can be attached to a direct liquid cooling cold plate, rear door heat exchanger, direct immersion cooling tank, or any type of cooling unit or system using the two phase fluid.

Figure 6:
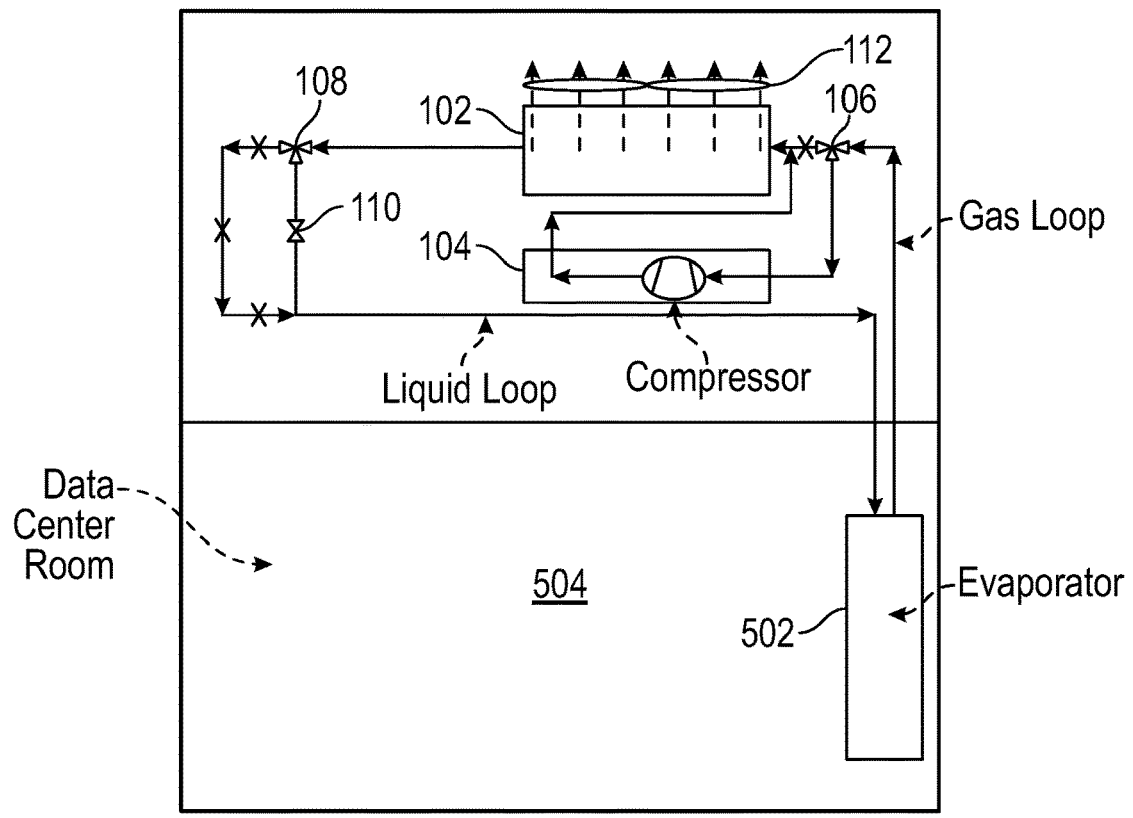
FIG. 6 depicts a system implementation using the cooling unit in compression cycle mode, in an embodiment.

FIG. 6 depicts a system implementation using the cooling unit 600 in a compression cycle mode, also called a refrigeration cycle mode, in an embodiment. In the second or refrigeration cycle mode, the three-way valves 106, 108 (or other combination of valves in various embodiments) are operated so that the refrigerant follows the path that is not crossed out by "X" in FIG. 6, and the compressor 104 is operated (e.g., cycled on and off, or operated continuously or variably, depending on conditions and system design). The refrigerant is routed through the compressor 104, from the compressor 104 through the condenser 102, from the condenser 102 through one or more evaporators 502, and from the evaporator(s) 502 back to the compressor 104 in a refrigeration cycle loop.

Variations and further design aspects are discussed below. In some embodiments, the condenser 102 can be designed as a liquid cooled one, which means an external, liquid-based cooling source cools the condenser, such as a sea\lake water cooling source. The whole cooling architecture can be designed in several modules. This means a modular design concept can be applied to the architecture. Multiple two-way valves can be used to replace the three-way valves. The solution provided can be used as an intermediate loop or unit in a cooling infrastructure. This means the condenser can be connected to another cooling loop for some use cases. Different designs can be applied for the liquid loops for the two operating modes.

Figure 7:
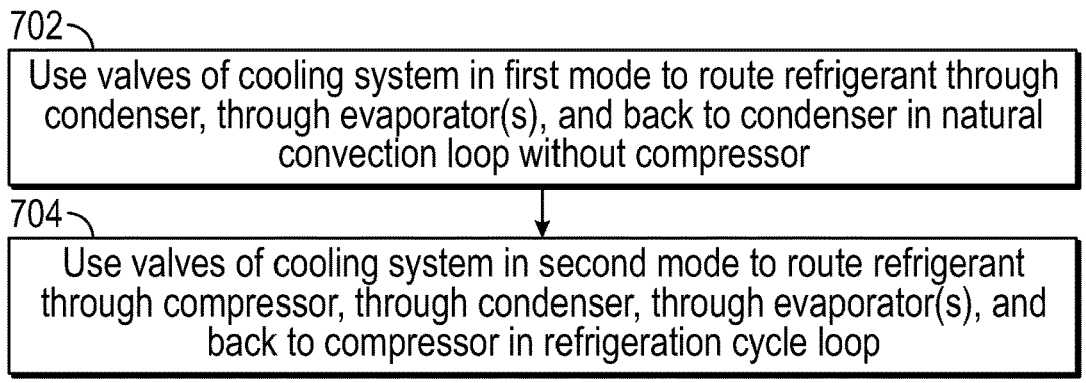
FIG. 7 is a flow diagram of a method of operating a cooling system.

FIG. 7 is a flow diagram of a method of operating the cooling system at different modes. The method can be practiced through manual operation of the components of various embodiments of the cooling system. The method can be practiced by the cooling system, more specifically by a controller in the cooling system. As an example, the fluid ports of inlet 932 and outlet 933 may be running the liquid supply and outlet vapor return, respectively.

In an action 702, valves of the cooling system are used in a first mode to route refrigerant through a condenser, through evaporator(s) and back to the condenser in a natural convection loop without a compressor.

In an action 704, valves of the cooling system are used in a second mode to route refrigerant through the compressor, through the condenser, through the evaporator(s) and back to the compressor in a refrigeration cycle loop.

Figure 8:
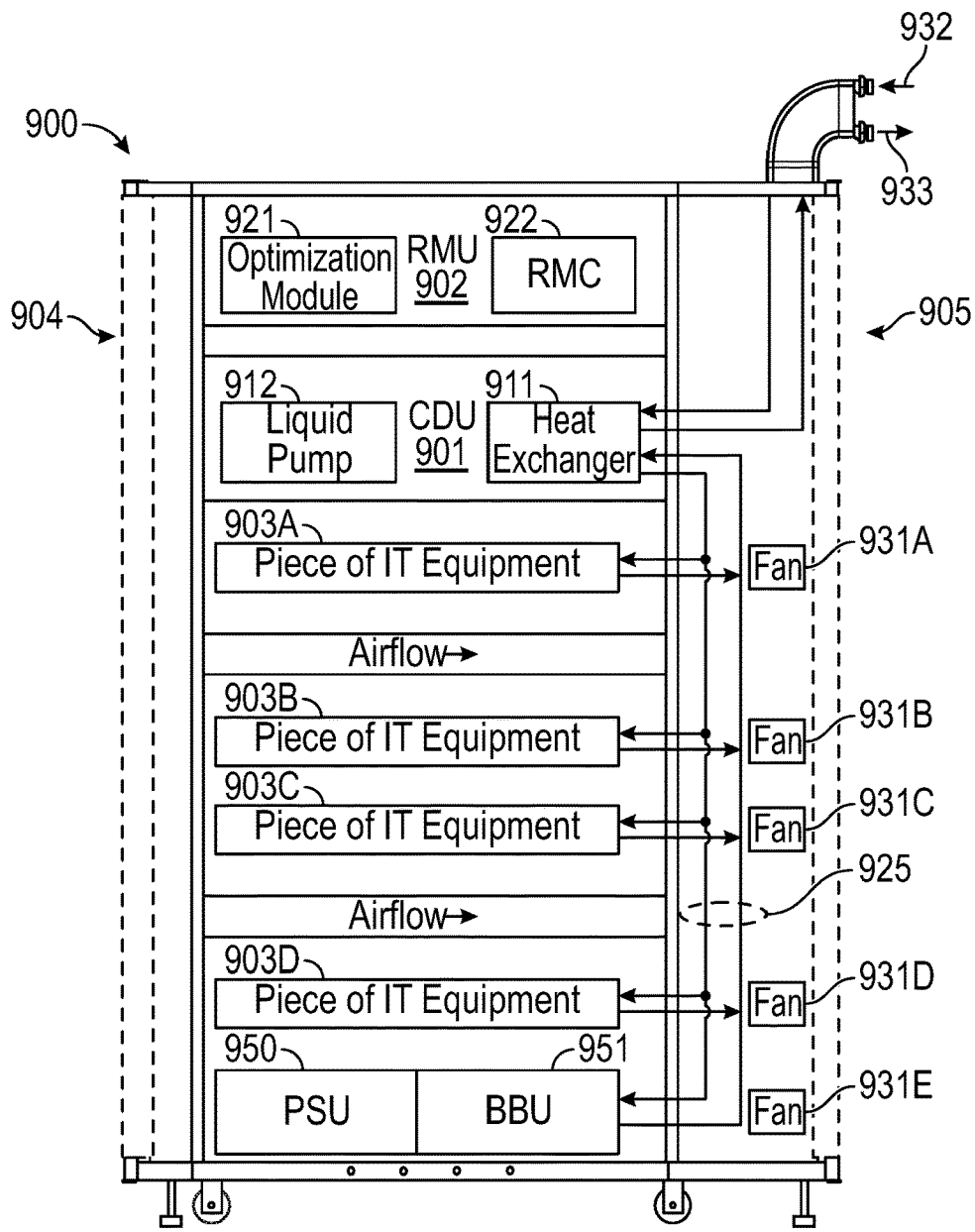
FIG. 8 depicts an example electronic rack that is suitable for cooling by embodiments of the cooling unit.

FIG. 8 depicts an example electronic rack that is suitable for cooling by embodiments of the cooling unit. Electronic rack 900 may be coupled to an external cooling unit as described throughout this application. In one embodiment, electronic rack 900 includes rack manifold and/or CDU 901, RMU 902, and one or more server blades 903A-903E (collectively referred to as server blades 903). Server blades 903 can be inserted into an array of standard slots respectively from frontend 904 of electronic rack 900. Note that although there are only five server blades 903A-903E shown in FIG. 8, more or fewer server blades may be maintained within electronic rack 900. Also note that the particular positions of CDU 901, RMU 902, and server blades 903 are shown for the purpose of illustration only; other arrangements or configurations of CDU 901, RMU 902, and server blades 903 may also be implemented. Further, the front door disposed on frontend 904 and the back door disposed on backend 905 are optional. In some situations, there may no door on frontend 904 and/or backend 905.

In one embodiment, rack manifold and/or CDU (manifold/CDU) 901 may be a rack manifold or an integrated unit having a rack manifold and a rack CDU integrated therein. Rack manifold/CDU 901 may be configured to have the identical or similar form factor of server shelves 903. Typically, a CDU includes heat an exchanger 911, a liquid pump 912, and a pump controller (not shown). The heat exchanger 911 may be a liquid-to-liquid heat exchanger. The primary loop of the CDU is coupled to an external cooling unit (e.g., room CDU) and/or a facility loop of a data center via supply line 932 and return line 933, such as the cooling unit as described above. The secondary loop of the rack CDU is coupled to the upstream ports of the rack manifold unit, where one or more downstream ports of the rack manifold are coupled to at least some of the server shelves 903, represented by liquid distribution loop 925.

With the flexible liquid cooling configuration using manifold/CDU unit 901, any of the server shelves 903 can hook up with manifold/CDU unit 901 to receive liquid cooling, as long as the cold plates are implemented in the server shelves. In this example, servers 903B-903C and 903E are liquid cooled by connecting with manifold/CDU 901, while server 903A and 903D are air cooled. There is no fixed or dedicated rack manifold implemented in the rack. With the rack manifold/CDU unit 901, a traditional air cooled electronic rack can be easily converted into a liquid cooled rack.

Each of server blades 903 may include one or more IT components (e.g., CPUs, GPUs, memory, and/or storage devices). Each IT component may perform data processing tasks, where the IT component may include software installed in a storage device, loaded into the memory, and executed by one or more processors to perform the data processing tasks. Server blades 903 may include a host server (referred to as a host node) coupled to one or more compute servers (also referred to as compute nodes). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the compute servers (having one or more GPUs) managed by the host server. The compute servers perform the actual tasks, which may generate heat during the operations.

Electronic rack 900 further includes RMU 902 configured to provide and manage power supplied to server blades 903 and manifold/CDU 901. RMU 902 may be coupled to a power supply unit (not shown) to manage the power consumption of the power supply unit, as well as other thermal management of the power supply unit (e.g., cooling fans 931A-931D). The power supply unit may include the necessary circuitry (e.g., an alternating current (AC) to direct current (DC) or DC to DC power converter, battery, transformer, or regulator, etc.,) to provide power to the rest of the components of electronic rack 900.

In one embodiment, RMU 902 includes optimal control logic 921 and rack management controller (RMC) 922. The optimal control logic 921 is coupled to at least some of server blades 903 to receive operating status of each of the server blades 903, such as processor temperatures of the processors, the current pump speed of the liquid pump 912, and liquid temperature of the cooling liquid, etc. Based on this information, optimal control logic 921 determines an optimal pump speed of the liquid pump 912 by optimizing a predetermined objective function, such that the output of the objective function reaches the maximum while a set of predetermined constraints is satisfied. Based on the optimal pump speed, RMC 922 is configured to send a signal to pump controller 210 to control the pump speed of liquid pump 912 based on the optimal pump speed. Electronic rack 900 further includes a power supply unit (PSU) 950 to provide power to servers of electronic rack 900 and backup battery unit (BBU) 951 to provide backup power when PSU 950 is unavailable. In one embodiment, electronic rack 900 is one of the electronic racks of a data center coupled to an external cooling unit via coolant supply line 932 and coolant return line 933 to receive liquid cooling as described above.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A cooling system, comprising:
    an ingress port to receive refrigerant in a vapor form from an evaporator;
    an egress port to return refrigerant in a liquid form back to the evaporator;
    a condenser coupled to the ingress port and the egress port and located at a higher elevation than the evaporator, wherein the refrigerant is driven by gravity to flow down from the condenser to the evaporator; and
    a compressor coupled to the ingress port and the condenser,
    a receiver having an input connected to an output of the condenser,
    an expansion valve directly connected to an output of the receiver, and
    a two-way valve connected across the expansion valve, wherein two-way valve is open in a first mode and closed in a second mode,
    wherein the cooling system is configured to have two operating modes including the first mode and the second mode based on an ambient condition, wherein the condenser is configured to receive and condense the refrigerant from the vapor form into the liquid form and to return the refrigerant in the liquid form to the egress port, without using a compressor, in response to the cooling system operating in the first mode, and
    wherein the compressor is configured to compress the refrigerant in the vapor form and to supply the compressed refrigerant to the condenser to be condensed therein in response to the cooling system operating in the second mode.

2. The system of claim 1, wherein the condenser is configured to condense the refrigerant in the vapor form using a natural convection manner.

3. The system of claim 2, further comprising a cooling fan to generate an air flow across a condenser coil while the refrigerant in the vapor form flows therein.

4. The system of claim 3, further comprising:
    one or more spray nozzles to spray liquid onto the condenser coil;
    a basin to receive the liquid across the condenser coil; and
    a liquid pump to recirculate the liquid back to the spray nozzles.

5. The system of claim 1, further comprising a first three-way valve coupled to the condenser, the ingress port, and the compressor, wherein during the first mode, the first three-way valve is configured to connect the condenser directly with the ingress port without going through the compressor.

6. The system of claim 5, wherein during the second mode, the first three-way valve is configured to divert the refrigerant from the ingress port to the compressor, which in turn supplies the compressed refrigerant to the condenser.

7. The system of claim 1, further comprising a temperature sensor configured to sense an ambient temperature, wherein the first mode is activated when the ambient temperature is below a predetermined threshold.

8. The system of claim 1, wherein the condensed refrigerant is returned in a liquid form to egress port due to gravity without using a liquid pump.

9. The system of claim 1, further comprising a three-way valve coupled between an output of the condenser and the egress port, wherein the three-way valve is configured to divert the refrigerant from the condenser to a return path coupled to the egress port via an expansion path.

10. The system of claim 1, further comprising:
    a three-way valve connected to an input of the condenser and an input of the compressor.

11. A data center system, comprising:
a plurality of electronic racks, each electronic rack includes a plurality of server arranged in a stack, each server including one or more processors each being attached to a cold plate; and
a cooling unit coupled to the cold plates of the electronic racks to provide liquid cooling to the processors, wherein the cooling unit comprises
an ingress port to receive refrigerant in a vapor form from at least one of the electronic racks,
an egress port to return refrigerant in a liquid form back to the electronic racks,
a condenser coupled to the ingress port and the egress port and located at a higher elevation than the electronic racks, wherein the refrigerant is driven by gravity to flow down from the condenser to the electronic racks, and
a compressor coupled to the ingress port and the condenser,
a receiver having an input connected to an output of the condenser,
an expansion valve directly connected to an output of the receiver, and
a two-way valve connected across the expansion valve, wherein two-way valve is open in a first mode and closed in a second mode,
wherein the cooling system is configured to have two operating modes including a first mode and a second mode based on an ambient condition, wherein the condenser is configured to receive and condense the refrigerant from the vapor form into the liquid form and to return the refrigerant in the liquid form to the egress port, without using a compressor, in response to the cooling system operating in the first mode, and
wherein the compressor is configured to compress the refrigerant in the vapor form and to supply the compressed refrigerant to the condenser to be condensed therein in response to the cooling system operating in the second mode.

12. The data center system of claim 11, wherein the condenser is configured to condense the refrigerant in the vapor form using a natural convection manner.

13. The data center system of claim 12, wherein the cooling unit comprises a cooling fan to generate an air flow across a condenser coil while the refrigerant in the vapor form flows therein.

14. The data center system of claim 13, wherein the cooling unit comprises:
one or more spray nozzles to spray liquid onto the condenser coil;
a basin to receive the liquid across the condenser coil; and
a liquid pump to recirculate the liquid back to the spray nozzles.

15. The data center system of claim 11, wherein the cooling unit comprises a first three-way valve coupled to the condenser, the ingress port, and the compressor, wherein during the first mode, the first three-way valve is configured to connect the condenser directly with the ingress port without going through the compressor.

16. The data center system of claim 15, wherein during the second mode, the first three-way valve is configured to divert the refrigerant from the ingress port to the compressor, which in turn supplies the compressed refrigerant to the condenser.

17. The data center system of claim 11, wherein the cooling unit comprises a temperature sensor configured to sense an ambient temperature, wherein the first mode is activated when the ambient temperature is below a predetermined threshold.

18. The data center system of claim 11, wherein the condensed refrigerant is returned in a liquid form to egress port due to gravity without using a liquid pump.

19. The data center system of claim 11, wherein the cooling unit comprises a three-way valve coupled between an output of the condenser and the egress port, wherein the three-way valve is configured to divert the refrigerant from the condenser to a return path coupled to the egress port via an expansion path.

20. The data center system of claim 11, wherein the cooling unit comprises:
a three-way valve connected to an input of the condenser and an input of the compressor.

* * * * *